United States Patent [19]

Mate

[11] 4,242,665

[45] Dec. 30, 1980

[54] TWO-WIRE TRANSMITTER

[75] Inventor: David J. Mate, San Diego, Calif.

[73] Assignee: Action Instruments Company, Inc., San Diego, Calif.

[21] Appl. No.: 942,638

[22] Filed: Sep. 15, 1978

[51] Int. Cl.³ ...................... G08C 19/04; G01R 27/00

[52] U.S. Cl. ............................ 340/870.38; 323/75 N; 324/62; 324/DIG. 1; 340/870.39

[58] Field of Search ................. 340/177 VC, 177 VA, 340/210, 347 SH, 595, 599, 186, 187; 307/352, 353; 323/1, 6, 75 C, 75 N; 324/62, DIG. 1; 73/362 R, 362 AR, 359 R

[56] References Cited

U.S. PATENT DOCUMENTS

| | | | |
|---|---|---|---|
| B 510,026 | 4/1976 | Grindheim | 340/210 |
| 3,503,261 | 3/1970 | Riester et al. | 340/210 |
| 3,717,858 | 2/1973 | Hadden | 340/177 VA |
| 3,800,300 | 3/1974 | Oosterhout | 340/177 VA |
| 4,083,039 | 4/1978 | Simon | 340/210 |
| 4,143,550 | 3/1979 | Kobayashi | 324/DIG. 1 |

*Primary Examiner*—John W. Caldwell, Sr.
*Assistant Examiner*—James J. Groody
*Attorney, Agent, or Firm*—Brown & Martin

[57] ABSTRACT

Disclosed is a two-wire transmitter which transmits information over a pair of wires having an external supply connected thereto. The transmitter receives its power from the pair of wires and stores a portion of this power during spaced apart first time intervals. This stored power is used to excite an external sensor during second time intervals that are substantially shorter than the first time intervals and which lie between respective ones of the first time intervals. The excitation response from the sensor is sampled and held in synchronization with this excitation. A variable resistance device is included for insertion in series with the pair of wires. This device is responsive to the held excitation response from the sensor to allow a current representative thereof to flow through the pair of wires.

10 Claims, 5 Drawing Figures

TWO-WIRE TRANSMITTER

BACKGROUND OF THE INVENTION

This invention relates to two-wire transmitters that operate in conjunction with a current loop. The loop includes an external power supply, a pair of wires from the supply, and the transmitter connected serially between the wires. An external sensor also connects to the transmitter. In operation the transmitter energizes the sensor, and in response it receives information signals from the sensor. This information is transmitted on the pair of wires by varying the current loop in the current loop. That is, the transmitter acts as a variable current sink; and the amount of current which it sinks is representative of the information from the sensor.

Due to various industry standards, two-wire transmitters must operate under certain constraints. One of these constraints is that the loope current can vary only between four milliamps and twenty milliamps. This insures that the other devices in the loop, such as recorders, will properly interpret the loop current signal. Another constraint, is that the external power supply must have a relatively small voltage output. Typically, a loop supply voltage of 28 volts DC is used. This limitation is imposed for safety reasons. As a result, the amount of power which the two-wire transmitter may draw from the current loop to use for its operation is severely limited. In fact, various types of sensors exist which require more power for the excitation than can be drawn from the loop. Accordingly, two-wire transmitters could not in the past be used with these type of sensors.

A standard strain gage is one sensor, for example, which falls into this category. The strain gage is comprised of four resistors which are interconnected to form a bridge. Typically, the bridge resistance is 100 ohms. Thus, when four volts is used to excite the bridge, power dissipated therein is voltage squared divided by resistance or 160 milliwatts. This amount of power can, of course, be made less by applying a smaller excitation voltage; however, bridge sensitivities are small, with 3 millivolts per volts being very common. Thus, a large excitation voltage is desirable in order that the output from the bridge have a reasonable signal to noise ratio.

In addition to power being dissipated in the sensor, power is also dissipated in the two-wire transmitter itself. However, even if we assume that no power is dissipated in the transmitter, a 100 ohm bridge with four volts of excitation would not be feasible due to the above described industry standard power constraints. Suppose for example, the signals from the sensor were such that the transmitter was required to sink only four milliamps. Simultaneously of course, the transmitter must receive the 160 milliwatts of power from the loop. Thus, the voltage drop required across the transmittter would be 160 milliwatts divided by 4 milliamps or 40 volts. This of course, is greater than the 28 volts that is available from the external supply. Prior art two-wire transmitters do not solve this problem.

Therefore, it is one object of the invention to provide an improved two-wire transmitter.

Another object of the invention is to provide a two-wire transmitter which excites an external sensor at a power level which is greater than the power level which the transmitter can continuously draw from the two-wire loop.

SUMMARY OF THE INVENTION

These and other objectives are accomplished in accordance with the invention by a two-wire transmitter comprising a DC to DC converter for receiving a predetermined amount of power from a two-wire current loop. Also included in the transmitter is an excitation supply which stores a portion of the received power during spaced apart intervals. This supply then excites the external sensor with the stored power during second time intervals that lie between respective ones at the first time intervals. Also, these second time intervals are substantially shorter than the first time intervals. Thus, the average power that is dissipated during the second time intervals is substantially greater than the average power received during the first time intervals. A sample and hold circuit is included in the transmitter for sampling and holding the excitation output of the sensor in synchronization with its excitation. This held response is fed to a variable resistance device that is inserted in a series with the pair of wires that comprise the current loop. This device is responsive to the held sensor output such that a current representative of the held output is allowed to flow through the current loop.

BRIEF DESCRIPTION OF THE DRAWINGS

Various details of a two-wire transmitter constructed according to the invention will best be understood by referring to the following drawings when read in conjunction with the detailed description, where.

DETAILED DESCRIPTION

Figure 1:
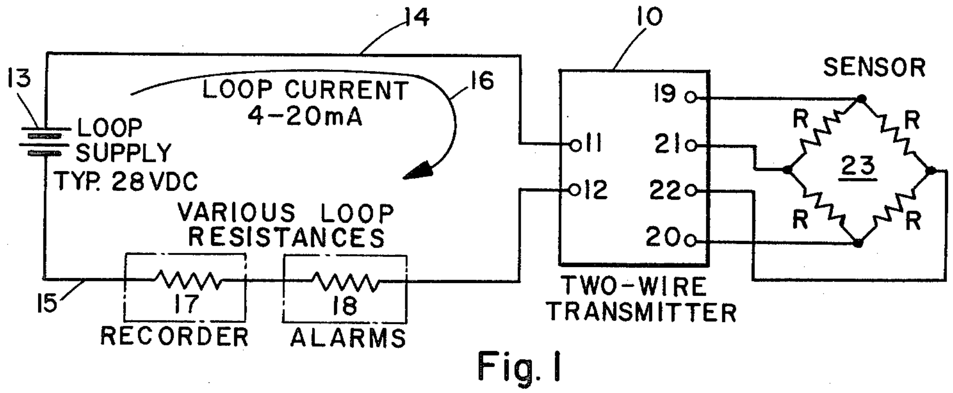
FIG. 1 is a system diagram illustrating a two-wire transmitter in an operating system.

Referring now to FIG. 1, the disclosed device 10 is illustrated within an operating system. Included within device 10 are a pair of terminals 11 and 12 that are connected to an external power 13 via a pair of wires 14 and 15. This configuration forms a current loop 16. Various other devices, such as a recorder 17 or an alarm 18 may also be serially inserted in loop 16.

Transmitter 10 further includes a pair of sensor excitation terminals 19 and 20; and a pair of sensor response terminals 21 and 22. In operation, terminals 19 and 20 are connected to inputs on a sensor 23 for activating the sensor; and terminals 21 and 22 are connected to outputs on sensor 23 for receiving information signals therefrom. Preferably, external sensor 23 is a resistance bridge as illustrated.

In response to the information signals received at terminals 21 and 22, transmitter 10 operates to vary the resistance between terminals 11 and 12 such that the current which flows in loop 16 is representative of the information received from sensor 23. The manner in which this function is performed may best be understood by referring to the block diagram of transmitter 10 in FIG. 2. As therein illustrated, transmitter 10 includes a power inverter 30 in series with terminals 11 and 12. Inverter 30 provides a means for receiving a predetermined amount of power via the wires 14 and 15 from external supply 13. This power is primarily used to energize sensor 23. In addition however, this power is also utilized to energize all of the components of transmitter 10. However, each of these components is constructed to have extremely low power dissipation in order that substantially all of the power from inverter 30 is available to excite sensor 23.

An excitation supply 31 is included within transmitter 10 to receive power from inverter 30 and apply it to sensor 23. Supply 31 operates to store a portion of the power received from inverter 30 during spaced apart first time intervals, and to excite sensor 23 with this stored power during second time intervals which are spaced between respective ones of the first time intervals. To this end, supply 31 includes an input 32 for receiving a timing control signal A. This signal is illustrated in the timing diagram of FIG. 3. When signal A is high, supply 31 excites sensor 23; and when signal A is low, supply 31 stores power from inverter 30. In general, the power storage time interval is substantially larger than the excitation interval. This allows supply 31 to excite sensor 23 with short bursts of power at a level which cannot be maintained continuously because the power that would be required to be drawn from loop 16 would be prohibitive. Suitably, power is stored within supply 31 for 40 milliseconds; and subsequently is dissipated in sensor 23 in approximately 2.5 milliseconds. Thus, a ten to one step up in instantaneous power that is used to excite sensor 23 is achieved.

Figure 3:
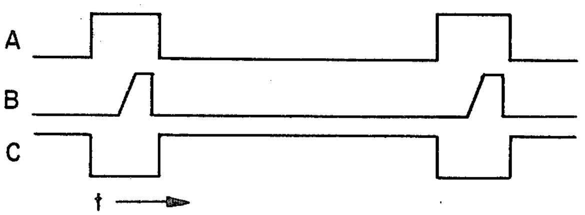
FIG. 3 is a timing diagram of various signals that occur in the block diagram of FIG. 2.

Also included in transmitter 10 is an amplifier 33 and a sample and hold circuit 35. These modules receive the excitation response of sensor 23. Circuit 35 is activated by a timing signal B. This signal occurs in synchronization with signal A as illustrated in FIG. 3. Signal B lies with signal A in order to insure that sensor 23 is activated through the time that its response is being sampled. Further, the leading edge of signal B lags the leading edge of signal A in order to insure that the output of the sensor has settled to a correct value before the sample is taken.

An output stage 37 is also included within transmitter 10. This stage inserts a variable resistance between terminals 11 and 12 to thereby provide a means for varying the current in loop 16 in a manner which is representative of the held response from sensor 23. Preferably, the variable resistance is provided by a transistor 38 whose collector and emitter are respectively coupled between terminals 11 and 12. Base current for transistor 38 is provided by an amplifier 39 and a transistor 40. A lead 42 from sample and hold circuit 35 provides a non-inverting input to amplifier 39. The inverting input to amplifier 39 is provided by a resistor 41 and a lead 43. The conductance of the transistor 38 varies in proportion to the difference between the held sensor response signal on line 42 and the voltage across the fixed resistor 41. The voltage across resistor 41 is a measure of the current in loop 16. Thus by feeding this current measuring signal back to amplifier 39, the current in loop 16 is made proportional to the held sensor response signal on lead 42.

The disclosed transmitter also includes an auto-zeroing amplifier 45. This amplifier has an input coupled via lead 34 to the output amplifier 33; and it has an output coupled via a lead 46 to an input on amplifier 33. The purpose of these interconnections is to allow amplifier 45 to sense the output of amplifier 33, and in response to generate a signal on lead 46 which will force the output of amplifier 33 to 0. The time at which this function is performed is determined by a control signal C on a lead 47. Signal C activates the auto-zeroing function by a high voltage level during the time that sensor 23 is not being excited. This is illustrated in FIG. 3. As a result of the zeroing operation, the output of amplifier 34 is not subject to drift or normal mode noise.

A timing circuit 48 is also included within transmitter 10. Circuit 48 generates the timing signals A, B, and C which were previously referred to and which are illustrated in FIG. 3. These signals are respectively generated by circuit 48 on leads 32, 36, 47.

Figure 2:
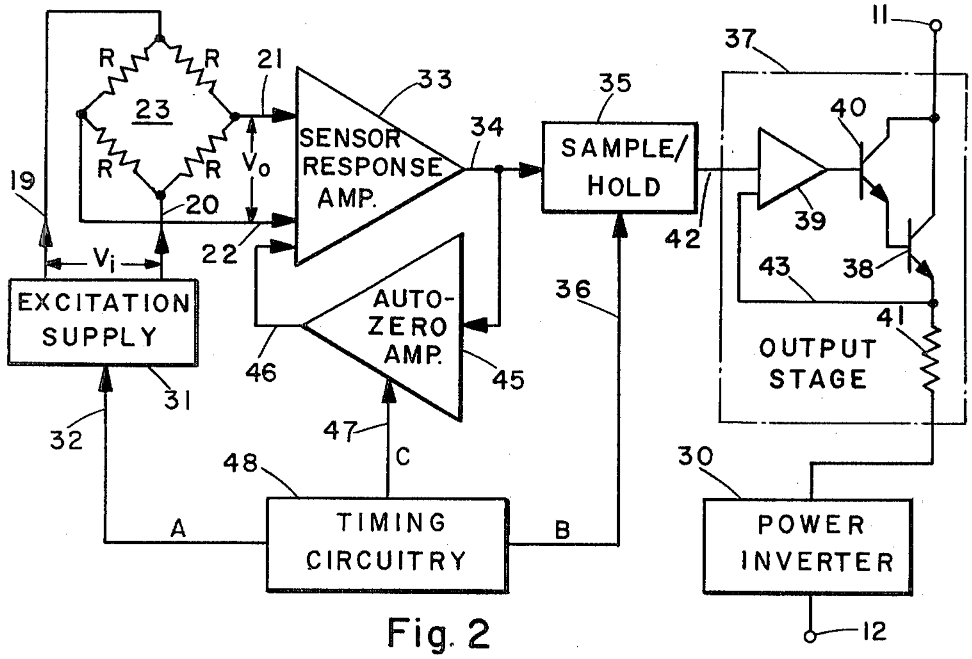
FIG. 2 is a block diagram of the two-wire transmitter of FIG. 1.
Figure 4:
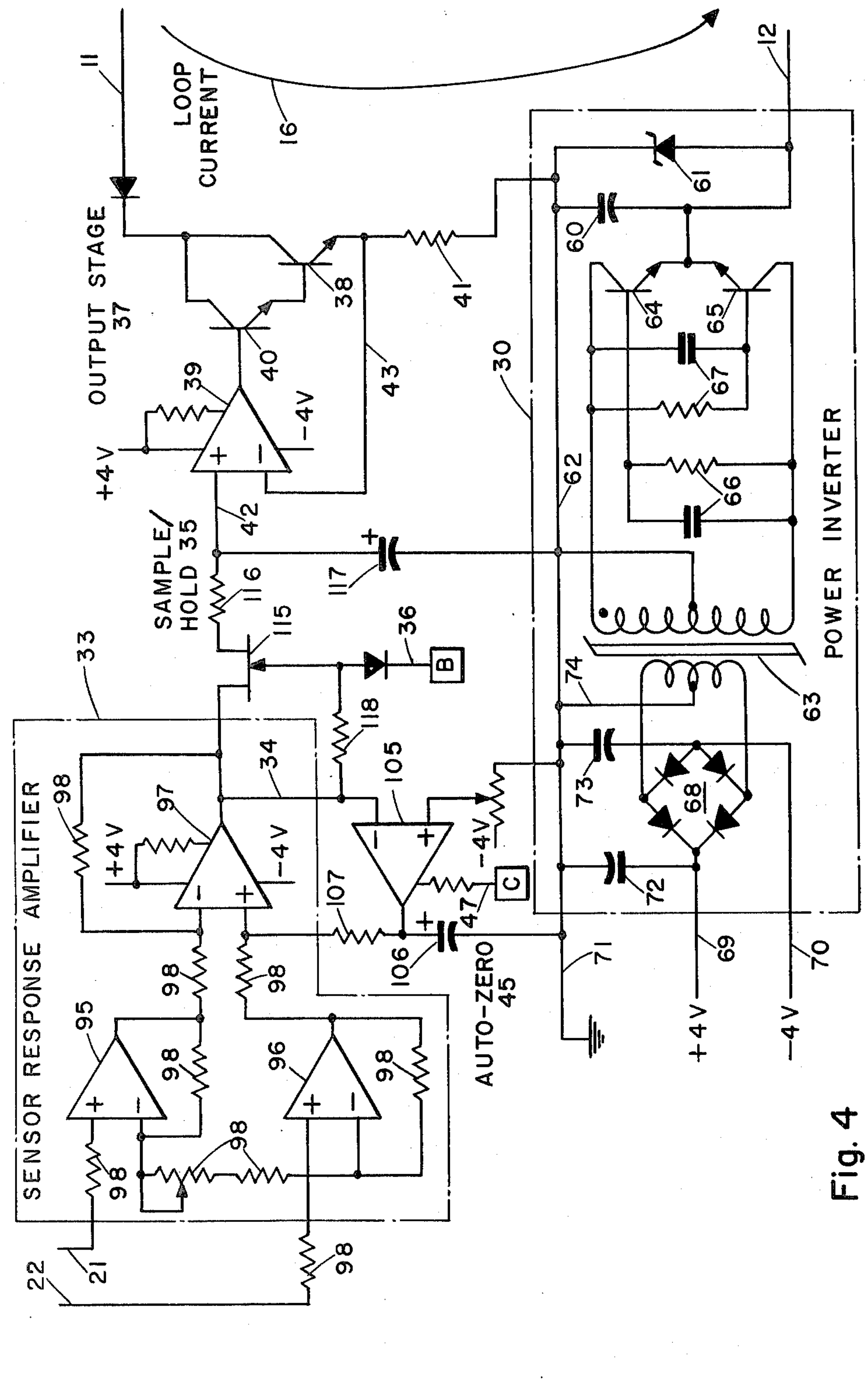
FIG. 4 is a detailed circuit diagram of various modules of the block diagram of FIG. 2.

A preferred embodiment for each of the modules in FIG. 2 will now be described in conjunction with FIGS. 4 and 5. In FIG. 4 for example, a detailed circuit diagram of power inverter 30 is illustrated. The input portion of inverter 30 includes a capacitor 60, a zener diode 61, an oscillator 62, and a transformer 63. Capacitor 60 and diode 61 operate to supply a DC bias voltage to oscillator 62. This is converted by the oscillator into an oscillating signal in the primary winding of transformer 63. A pair of transistors 64 and 65 with positive feedback components 66 and 67 respectively are included within oscillator 62 to generate this oscillating signal.

The output portion of inverter 30 includes four diodes 68 which are configured as a full wave rectifier connected to the secondary winding of transformer 63. Plus four volts is developed at one node 69 of these diodes; while minus four volts is developed at another node 70. These voltages are referenced to point 71 in the current loop by means of components 72, 73, and 74.

As was pointed out earlier in this disclosure, the two-wire transmitter must be operable at low input power levels in order to be compatible with certain industry standards. To meet this requirement, conventional off-the-shelf modules cannot merely be substituted into the block diagram of FIG. 2. For example, typical DC-DC converters use at least 100 milliwatts when they are just idling. In comparison, the preferred embodiment of power inverter 30 has a transformer 63 with a core that is specially selected to have low losses. This allows the inverter to operate at a power level of approximately 20 milliwatts. To further minimize wasted power, diodes 68 are germanium diodes rather than the conventionally used silicon diodes. Germanium diodes need only approximately two tenths of a volt before conduction occurs; whereas silicon diodes require approximately six tenths of a volt.

One of the loads for the plus four volts that is developed by inverter 30 is excitation supply 31. A detailed circuit diagram of this supply is illustrated in FIG. 5. During the time intervals when control signal A is low, the plus four volts charges a capacitor 80 in supply 31 through a resistor 81. The voltage across capacitor 80 is limited by a zener diode 82. Conversely, during the time intervals when control signal A is high, the voltage on capacitor 80 is discharged through a transistor 83 to node 19 in order to excite the external sensor 23. Transistor 83 is turned on and turned off in response to control signal A by means of a programmable operational amplifier 84 and transistor 85.

When signal A is in a low state, amplifier 84 is turned off. Consequently, no base current is supplied to transistor 85 which turns off; and therefore no base current is supplied to transistor 83 which also turns off. This during this time interval, components 83, 84, and 85 are all off and consume no power. Conversely, when control signal A is high, amplifier 84 turns on and supplies base current to transistor 85. This turns transistor 85 on, which in turn turns on transistor 83. Under these conditions, the power that is consumed by components 83, 84, and 85 is not zero but it is still relatively low. For example, the power required by amplifier 84 can be controlled by the amount of current that is injected into its inputs. This is controlled by appropriately biasing amplifier 84 via circuits 86, 87, and 88. By this means, power discipation in amplifier 84 is held at approximately 0.3 milliwatts.

The average current (or average power) with which supply 31 excites sensor 23 is determined by the magnitude of capacitor 80, the voltage drop that occurs across capacitor 80 during the excitation period, and the length of the excitation time interval. Specifically, average excitation current equals the value of the capacitance 80 times the voltage drop that occurs across it divided by the time interval in which the drop occurs. Suitably, capacitor 80 is 120 microfarads and the excitation period is 3 milliseconds. With these parameters, a drop from four volts to approximately two volts occurs across capacitor 80 when a 100 ohm bridge is excited. Thus, the average excitation current equals 120 microfarads times two volts divided by 3 milliseconds. This equals 80 milliamps, which of course would be impossible to supply continuously to the sensor because of the maximum loop circuit 16 is only 20 milliamps.

Referring now back to FIG. 4, a detailed circuit for amplifier 33 which receives the excitation response from sensor 23 will be described. This amplifier preferably is realized with three micro-power operational amplifiers 95, 96, and 97 such as the siliconic L144. Various input and feedback resistors 98 are also included with these amplifiers in order to adjust their gain to a suitable level. Typically, the signals received on nodes 21 and 22 from the sensor are on the order of one or two millivolts. Thus, the signals are subject to noise pickup; and the balanced amplifier configuration that is illustrated is used to reject the common mode portion of this noise.

The normal mode portion of noise in signals received from nodes 21 and 22 is compensated for by auto-zero circuit 45. This circuit also compensates for thermal drift within amplifier 33. Basically, circuit 45 consists of a programmable operational amplifier 105, a holding capacitor 106, and a summing resistor 107. During the time interval that the bridge is not being excited, control signal C activates amplifier 105. This amplifier then operates to generate a voltage on capacitor 106 such that the output voltage of amplifier 97 is zero. In this state, total power consumed by amplifier 105 is approximately 1.7 milliwatts. Conversely, when the bridge is being excited, control signal C turns off amplifier 105. In this state, no power is consumed by the amplifier. Also in this state, the voltage on capacitor 106 continues to supply a noise and thermal drift compensating current through resistor 107, thus insuring that the output of amplifier 97 is a true reflection of the excitation response signal.

A detailed circuit diagram of sample and hold circuit 35 is also illustrated in FIG. 4. This circuit is comprised of a field effect transistor 115, resistors 116 and 118, and a capacitor 117. When control signal B on lead 36 is high, transistor 115 becomes conductive and allows capacitor 117 to charge to the output level of amplifier 97. Conversely, when signal B is low, transistor 115 operates as an extremely high impedance device. Thus, the voltage on capacitor 117 is held at a constant level. Preferably, transistor 115 is operated in the depletion mode and as such consumes no power during the switching process.

The voltage on the holding capacitor 117 is fed to output stage 37 via lead 42. This output stage includes transistors 38 and 40, operation amplifier 39, and feedback resistor 41. As the voltage across capacitor 117 increases, amplifier 39 increases the base current drive for transistor 40. Thus, more base current is supplied to transistor 38, and this in turn lowers the collector to emitter resistance of that transistor. As a result, the loop current 16 is increased; which in turn increases the voltage on lead 43. This lead connects to the inverting input of amplifier 39 to provide negative feedback. Amplifier 39 will continue to increase the base current drive for transistor 40 until increase in voltage on lead 43 balances the voltage held on capacitors 117.

Figure 5:
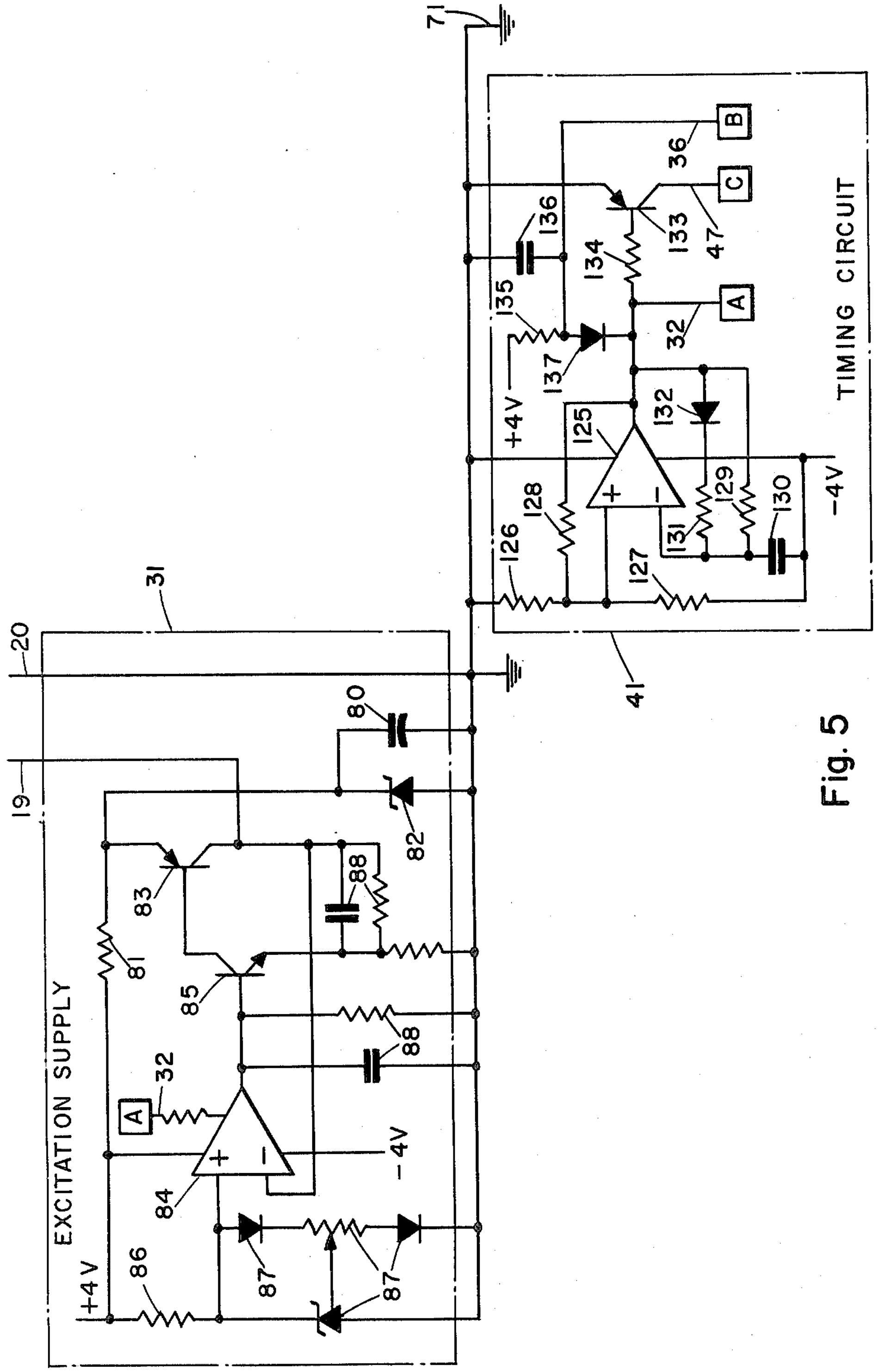
FIG. 5 is a detailed circuit diagram of the remaining modules of the block diagram of FIG. 2.

Referring now back to FIG. 5, the details of a preferred embodiment for timing circuitry 48 will be described. This embodiment includes a differential amplifier 125 which has various feedback components connected thereto for the purpose of making the amplifier generate control signal A. Resistors 126 and 127 are provided to bias the non-inverting input of amplifier 125 to a predetermined voltage; and resistor 128 is included to vary this bias point via positive feedback from the amplifiers output.

Assume, for example, that the output of amplifier 125 is at minus four volts. Due to resistors 126–128, the non-inverting input of amplifier 125 will be at approximately minus 1.3 volts. The output of amplifier 125 is also coupled to its inverting input through a resistor 129 and capacitor 130. Thus, the voltage at the inverting input will slowly charge to minus four volts in accordance with the RC time constant of components 129 and 130. When this voltage drops below a minus 1.3 volts, the output of amplifier 125 will switch to a positive value. This positive voltage is fed back through resistor 128 to the non-inverting input of amplifier 125. Accordingly, the output of amplifier 125 becomes even more positive and rapidly switches to its maximum positive output of plus four volts.

Capacitor 130 now tends to charge to plus four volts. Current for this charging operation however, is supplied through resistor 129 and another resistor 131 through a diode 132. Thus, capacitor 130 charges to plus four volts substantially faster than it charges to minus four volts. This makes the positive pulse width of a signal A relatively small because when the voltage at the inverting input of amplifier 125 becomes larger than the voltage at the non-inverting input, the output then rapidly increases due to the positive feedback of resistor 128.

As described above, amplifier 125 is never in a linear mode of operation. Thus it consumes very little power. For example, only approximately 0.8 milliwatts of power are consumed when amplifier 125 is an RCA 3130 chip.

Timing circuit 41 also includes a transistor 133 and a resistor 134. These components are interconnected as illustrated to form an inverter for the output of amplifier 125. The output of this inverter forms signal C. Further included in timing circuit 41 is a resistor 135, a capacitor 136, and a diode 137. These components are interconnected to form timing signal B. When signal A is high, diode 137 is non-conductive, and thus capacitor 136 charges through resistor 135 to plus four volts. Conversely, when signal A is low, diode 137 becomes conductive and rapidly discharges capacitor 136. Signals A, B, and C thus, have the waveforms as was previously described in conjunction with FIG. 3.

A preferred embodiment of the invention has now been described in detail. However, it is to be understood that various changes and modifications can be made to these details without departing from the nature and spirit of the invention. Therefore, the invention is not to be limited to said details but is defined by the appended claims.

I claim:

1. A two-wire transmitter for tramsitting information via a pair of wires having an external power supply connected thereto, said transmitter comprising;

means for receiving a predetermined amount of power via said pair of wires from said external power supply;

means for storing a portion of said received power during spaced apart first time intervals;

means for exciting an external sensor with said stored power during second tie intervals that are substantially shorter than said first time intervals and are spaced between respective ones of said first time intervals;

means for sampling and holding the excitation output of said sensor in synchronization with said excitation thereof; and variable resistance means for insertion in series with said pairs of wires and responsive to said held excitation output from said sensor to allow a current representative thereof to flow through said pairs of wires.

2. A transmitter according to claim 1 wherein said predetermined amount of power is less than 50 milliwatts.

3. A transmitter according to claim 2 wherein said means for receiving is a DC-DC converter having a low loss core that is operable at less than 50 milliwatts.

4. A transmitter according to claim 2 wherein said means for storing is a capacitor, and wherein said means for exciting is comprised of programmable amplifier means for gating charge from said capacitor to said external sensor in response to first control signals.

5. A transmitter according to claim 2 wherein said means for sampling and holding includes differential DC amplifier means for receiving said output from said sensor, and also includes a capacitor coupled through a field effect transistor means to the output of said amplifier for sampling and holding signals on said amplifier output in response to second control signals.

6. A transmitter according to claim 5 and further including means for zeroing the output of said amplifier during said first time intervals in response to third control signals.

7. A transmitter according to claim 2 wherein said variable resistance means includes a transistor and a fixed resistor for connection in series with said pair of wires, and further includes differential amplifier means for varying the conductance of said transistor in proportion to the difference between said held excitation output and the voltage across said fixed resistor.

8. A method of transmitting information via a two-wire transmitter comprised of the steps of:

receiving a predetermined amount of power from a pair of wires having an external power supply connected thereto;

storing a portion of said received power during spaced apart first time intervals;

exciting an external sensor with said stored power during second time intervals that are substantially shorter than said first time intervals and are spaced between respective ones of said first time intervals;

sampling and holding the response of said sensor in synchronization with said excitation thereof; and varying the resistance of a device in series with said pair of wires such that a current representative of said held response from said sensor flows through said wires.

9. A method according to claim 8 wherein said predetermined amount of power is less than 50 milliwatts.

10. A method according to claim 9 wherein said external sensor is excited at a power level during said second time intervals which is substantially greater the level at which power is drawn from said supply during said first time intervals.

* * * * *